United States Patent
Brandenburg et al.

(10) Patent No.: US 7,205,653 B2
(45) Date of Patent: Apr. 17, 2007

(54) FLUID COOLED ENCAPSULATED MICROELECTRONIC PACKAGE

(75) Inventors: Scott D. Brandenburg, Kokomo, IN (US); Suresh K. Chengalva, Kokomo, IN (US); Thomas A. Degenkolb, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 74 days.

(21) Appl. No.: 10/919,625

(22) Filed: Aug. 17, 2004

(65) Prior Publication Data

US 2006/0038284 A1 Feb. 23, 2006

(51) Int. Cl.
*H01L 23/10* (2006.01)
*H01L 23/14* (2006.01)
*H01L 23/34* (2006.01)

(52) U.S. Cl. .................. 257/714; 257/707; 257/713; 257/E23.098

(58) Field of Classification Search ................ 257/706, 257/707, 713, 714
See application file for complete search history.

(56) References Cited

U.S. PATENT DOCUMENTS

| | | | |
|---|---|---|---|
| 4,178,630 A | 12/1979 | Olsson | 363/141 |
| 5,150,274 A | 9/1992 | Okada et al. | 361/382 |
| 5,276,586 A | 1/1994 | Hatsuda et al. | 361/387 |
| 5,291,064 A * | 3/1994 | Kurokawa | 257/714 |
| 5,349,237 A | 9/1994 | Sayka et al. | 257/715 |
| 5,696,405 A | 12/1997 | Weld | 257/714 |
| 6,600,651 B1 | 7/2003 | Weng | 361/700 |
| 6,992,382 B2 * | 1/2006 | Chrysler et al. | 25/717 |
| 7,019,395 B2 * | 3/2006 | Hirano et al. | 257/717 |
| 2004/0066630 A1* | 4/2004 | Whittenburg et al. | 361/719 |
| 2005/0030717 A1* | 2/2005 | Inagaki et al. | 361/699 |

FOREIGN PATENT DOCUMENTS

| EP | 0709884 A | 5/1996 |
|---|---|---|
| JP | 0401550 A | 2/1992 |
| JP | 2002270748 A | 9/2002 |

OTHER PUBLICATIONS

EP 05 07 6743 European Search Report dated Feb. 2, 2006.

* cited by examiner

*Primary Examiner*—Nitin Parekh
(74) *Attorney, Agent, or Firm*—Jimmy L. Funke

(57) ABSTRACT

An encapsulated microelectronic package includes a fluid conducting cooling tube directly coupled to one or more semiconductor chips, with the encapsulant being molded over the semiconductor chips and portions of the cooling tube in proximity to the semiconductor chips. The encapsulant immobilizes the cooling tube with respect to the semiconductor chips, and the cooling tube and encapsulant are designed to minimize differences in their coefficients of thermal expansion relative to the semiconductor chips.

8 Claims, 2 Drawing Sheets

FLUID COOLED ENCAPSULATED MICROELECTRONIC PACKAGE

TECHNICAL FIELD

The present invention relates to fluid cooling of microelectronic packages, and more particularly to an encapsulated microelectronic package having integral fluid cooling.

BACKGROUND OF THE INVENTION

Various types of cooling mechanisms can be used to remove waste heat from high power semiconductor devices, with liquid cooling being used in cases where the waste heat and/or the ambient temperature are very high. In a typical liquid cooling application, the microelectronic devices are mounted on a heat exchanger or cold plate that has internal fluid conducting channels and inlet and outlet pipes for coupling it to a cooling system including a fluid reservoir, a pump and an external heat exchanger. Due to limited thermal conduction between the semiconductor devices and the cold plate, the cold plate must be relatively large and the pump must be capable of producing high fluid flow. As a result, such cooling systems tend to be too large, too heavy and too expensive for many applications. The thermal coupling between the semiconductor devices and the cooling system can be improved by integrating a cooling tube or heat pipe into the microelectronic package, as disclosed for example, in the U.S. Pat. Nos. 5,276,586; 5,349,237; 5,696,405; and 6,600,651. However, the packaging techniques disclosed in such patents are either overly expensive to implement or limited to use with a single semiconductor device. Accordingly, what is needed is a cost-effective way of liquid cooling high power microelectronic packages including any number of semiconductor devices.

SUMMARY OF THE INVENTION

The present invention is directed to a fluid cooled microelectronic package in which a fluid conducting cooling tube is directly coupled to one or more semiconductor chips and a plastic encapsulant is molded over the semiconductor chips and portions of the cooling tube in proximity to the semiconductor chips. The encapsulant immobilizes the cooling tube with respect to the semiconductor chips, and the cooling tube and encapsulant are designed to minimize differences in their coefficients of thermal expansion relative to the semiconductor chips.

In applications where the semiconductor chips have an active surface mounted on a substrate and an exposed inactive surface, the cooling tube is coupled to the inactive surfaces of chips, and the mold compound encapsulates the semiconductor chips and portions of the cooling tube and substrate in proximity to the semiconductor chips.

In applications where the semiconductor chips have two active surfaces, the cooling tube can function as a terminal of the microelectronic package or as an electrical bridge between a semiconductor chip and a shunt element disposed between the cooling tube and a terminal of the microelectronic package. In applications requiring electrical isolation between the semiconductor chips, the cooling tube may be segmented, with intervening electrically insulative fluid conducting sections.

DESCRIPTION OF THE PREFERRED EMBODIMENT

In general, the present invention is directed to fluid cooled microelectronic packages in which a fluid conducting cooling tube is coupled to one or more semiconductor chips and a plastic encapsulant is molded over the semiconductor chips and portions of the cooling tube in proximity to the semiconductor chips. As illustrated below, the cooling tube can be configured in different ways to accommodate lateral semiconductor chips having an exposed inactive surface or vertical semiconductor chips having an exposed active surface. In each case, the plastic encapsulant immobilizes the cooling tube with respect to the semiconductor chip to enhance reliability of the thermal joints, and the cooling tube and encapsulant are designed to minimize differences in their coefficients of thermal expansion relative to the semiconductor chip.

Figure 1:
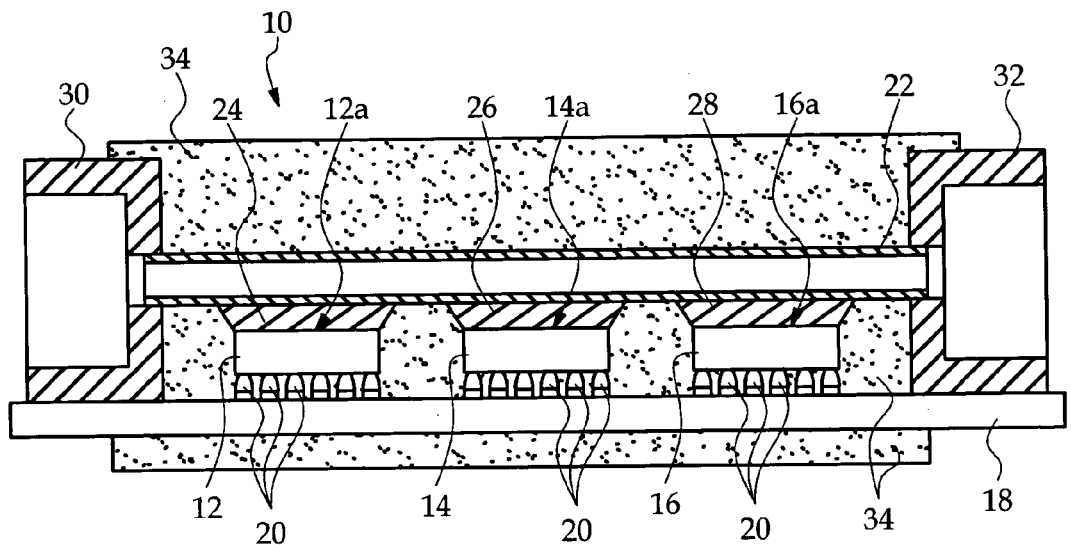
FIG. 1 depicts the liquid cooled encapsulated microelectronic package of this invention including a cooling tube coupled to inactive surfaces of lateral semiconductor chips mounted on a substrate.

Referring to FIG. 1, the reference numeral 10 generally designates a liquid cooled encapsulated microelectronic package according to a first embodiment of this invention. The package 10 includes a number of lateral semiconductor chips 12, 14, 16 mounted on a substrate 18 such as a printed circuit board. In the illustrated embodiment, the semiconductor chips 12, 14, 16 are configured as flip-chips or other surface mount components, with electrical connections between the chips and the substrate 18 being defined by multiple re-flowed solder bumps 20. A conductor pad is formed on the exposed or top surface 12a, 14a, 16a of each chip 12, 14, 16. Solder paste comprising primarily indium or other thermal interface materials is applied to each such conductor pad, and a copper cooling tube 22 (which may be circular or rectangular in cross-section) is positioned over the chips 12, 14, 16 so as to form solder joints 24, 26, 28 coupling the chips 12, 14, 16 to the cooling tube 22 when the assembly is heated to the re-flow temperature of the solder paste. In the illustrated embodiment, the ends of the cooling tube 22 are provided with fluid couplings 30, 32 that are secured to the substrate 18 (by a suitable structural adhesive, for example) in order to support and properly position the cooling tube 22 during solder reflow. Finally, the assembly is over-molded with a plastic/polymer encapsulant 34 such as a thermoset epoxy or thermoplastic compound or other potting material. As illustrated in FIG. 1, the encapsulant 34 covers the semiconductor chips 12, 14, 16, the cooling tube 22, and portions of the substrate 18 and fluid couplings 30, 32. In usage, a fluid coolant (which can be electrically conductive, if desired) is supplied to one of the couplings 30/32 and exhausted through the other coupling 32/30. Heat conduction from the chips 12, 14, 16 to the coolant in cooling tube 22 is very high due to the thermal properties of indium solder joints 24, 26, 28. The wall thickness of cooling tube 22 is kept to a minimum, and the encapsulant 34 is compounded to minimize differences in its coefficient of thermal expansion relative to that of the semiconductor chips 12, 14, 16. Additionally and significantly, the encapsulant 34 immobilizes the cooling tube 22 with respect to the chips 12, 14, 16. These factors contribute to good solder joint durability over repeated thermal cycling.

Figure 2:
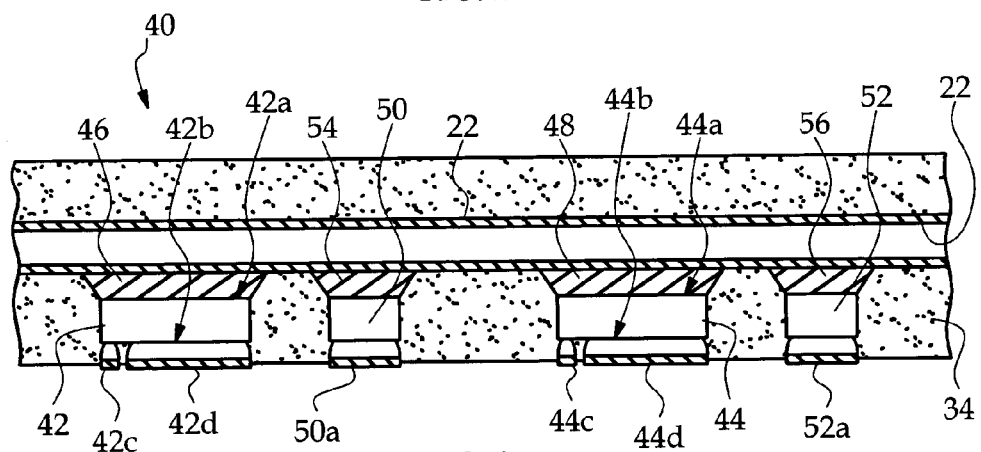
FIG. 2 depicts the liquid cooled encapsulated microelectronic package of this invention including a cooling tube coupled to active surfaces of vertical semiconductor chips, with no chip-to-chip electrical isolation.

FIG. 2 depicts a portion of a liquid cooled encapsulated microelectronic package 40 configured for one or more vertical semiconductor chips 42, 44. In the illustrated embodiment, the chips 42, 44 are depicted as three-terminal power devices such as MOSFETs or IGBTs; one primary terminal (a MOSFET source, for example) is provided on the top surface 42a, 44a of each chip 42, 44, while the other primary terminal (a MOSFET drain, for example) and a control terminal (a MOSFET gate, for example) are provided on the bottom surface 42b, 44b of each chip 42, 44. The terminals of the bottom surfaces 42b, 44b are soldered to lead frame elements 42c, 42d; 44c, 44d, and the encapsulant 34 is molded so that portions of the lead frame elements 42c, 42d; 44c, 44d are exposed as illustrated. The lead frame elements 42c–42d, 44c–44d are preferably a lamination of copper, molybdenum and copper to achieve a thermal coefficient of expansion that more closely matches that of the encapsulant 34 and the chips 42, 44. Alternatively of course, the chip terminals may be soldered to a substrate, as in the embodiment of FIG. 1. A copper cooling tube 22 is soldered to the top surface 42a, 44a of each chip 42, 44 by the indium solder joints 46, 48, forming an electrical bridge between primary terminals of each chip 42, 44, as is desired in certain applications. Copper slugs 50, 52 disposed adjacent each chip 42, 44 electrically couple the cooling tube 22 to respective lead frame terminals 50a, 52a which are utilized as device terminals of the package 40. Alternatively, the cooling tube itself may be utilized as the common primary electrical terminal of the package 40.

Figure 3:
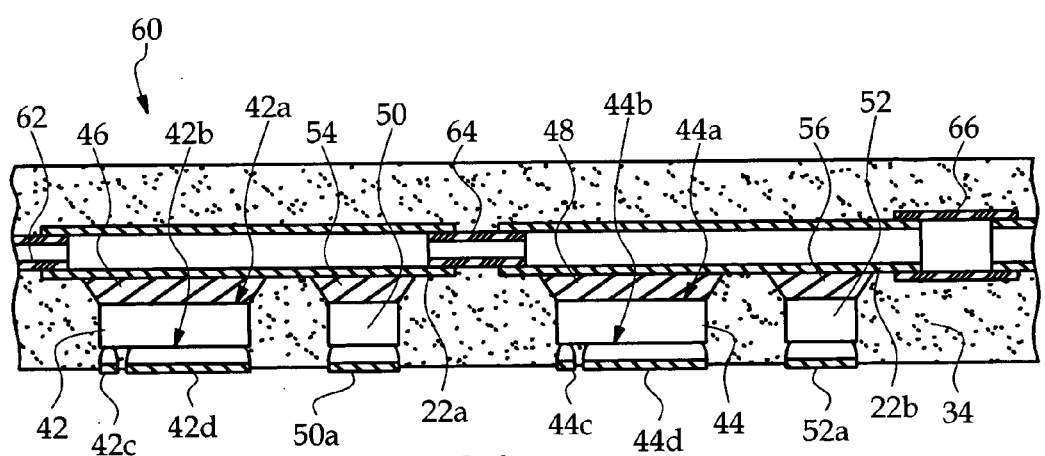
FIG. 3 depicts the liquid cooled encapsulated microelectronic package of this invention including cooling tube segments coupled to active surfaces of vertical semiconductor chips, and intervening sections of plastic tubing to provide chip-to-chip electrical isolation.
Figure 4:
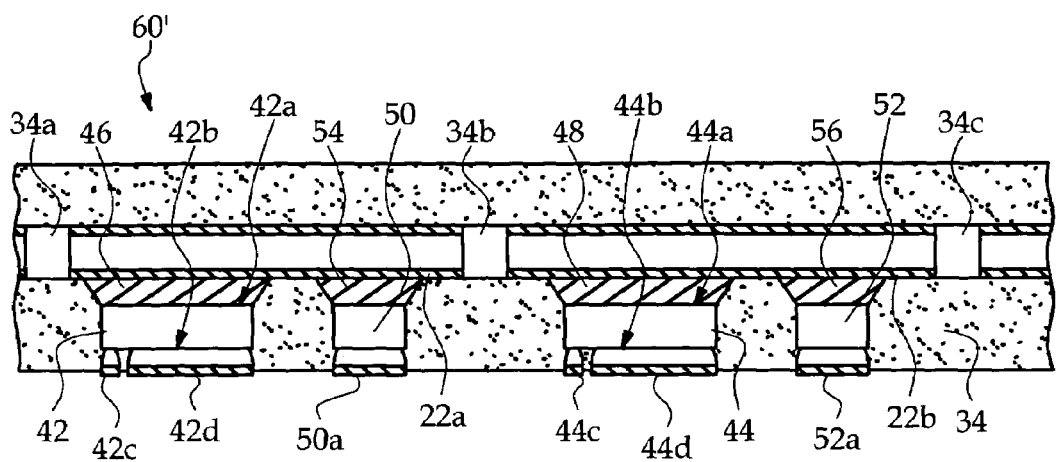
FIG. 4 depicts the liquid cooled encapsulated microelectronic package of this invention including cooling tube segments coupled to active surfaces of vertical semiconductor chips, and intervening encapsulant voids that provide chip-to-chip electrical isolation.

FIGS. 3 and 4 depict portions of liquid cooled encapsulated microelectronic packages 60, 60' similar to the package 40 of FIG. 2, but configured to provide electrical isolation between the vertical semiconductor chips 42, 44. In each case, the electrical isolation is achieved by forming the cooling tube 22 as a series of copper tube segments 22a, 22b with intermediate electrically insulative fluid coupling joints or sections. In the package 60 of FIG. 3, the fluid coupling joints are achieved with thermoplastic tubes 62, 64, 66 that engage either the interior or exterior peripheries of adjacent cooling tube segments 22a, 22b as shown. In the package 60' of FIG. 4, the fluid coupling joints are achieved with intervening voids 34a, 34b, 34c in the encapsulant 34. The voids 34a, 34b, 34c may be formed, for example, by inserting a silicone rod through the segments 22a, 22b prior to the over-molding of encapsulant 34; due to the high thermal coefficient of expansion of silicone relative to the other package materials, the silicone rod will expand during over-molding, bridging the gaps between adjacent cooling tube segments 22a, 22b. When the package 60' is subsequently cooled, the silicone will contract to a much greater extent than the other package materials, after which it may be removed, leaving the encapsulant voids 34a, 34b. Alternatively, the voids 34a, 34b may be preserved during over-molding by inflating and subsequently deflating and withdrawing a cooling tube balloon insert. Of course, the electrical isolation achieved by the intermediate fluid coupling joints in FIGS. 3 and 4 must be preserved by utilizing a coolant that is not electrically conductive.

Figure 5:
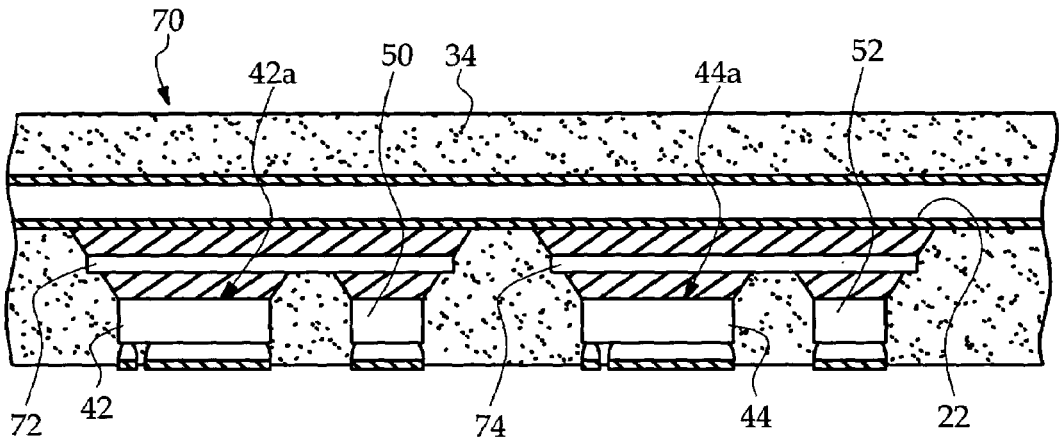
FIG. 5 depicts the liquid cooled encapsulated microelectronic package of this invention including a cooling tube coupled to active surfaces of vertical semiconductor chips through an electrically insulative ceramic substrate that provides chip-to-chip electrical isolation.

FIG. 5 depicts a portion of a liquid cooled encapsulated microelectronic package 70 for electrically isolated vertical semiconductor chips 42, 44, where the electrical isolation is achieved through the insertion of copper-clad (or other bonded metal) ceramic (or other electrically insulating, thermally conducting material) wafers 72, 74 between the cooling tube 22 and the top surfaces 42a, 44a of the chips 42, 44. In this case, the copper cladding on the bottom surface of the wafers 72, 74 forms the electrical bridge between the top surface 42a, 44a of each chip 42, 44 and the adjacent copper slug 50, 52, as opposed to the cooling tube 22. Accordingly, the cooling tube 22 may be continuous instead of segmented with intervening insulative fluid conducting joints.

Figure 6:
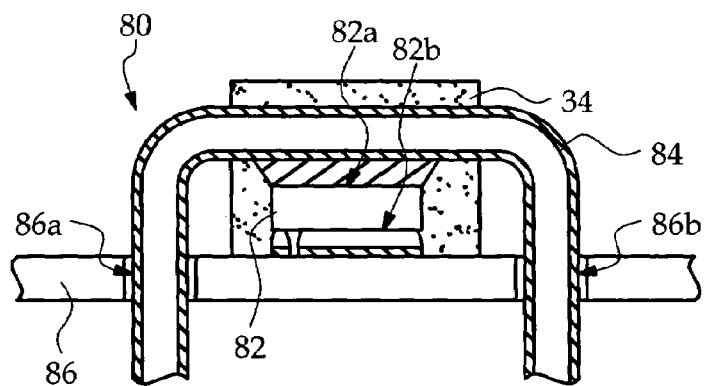
FIG. 6 depicts the liquid cooled encapsulated microelectronic package of this invention including a cooling tube coupled to an active surface of a vertical semiconductor chip, and utilized as an electrical terminal of the chip.

FIG. 6 depicts a liquid cooled encapsulated microelectronic package 80 for a vertical semiconductor chip 82, where a copper cooling tube 84 soldered to the top surface 82a of chip 82 is utilized as an electrical terminal of the chip 82. The chip 82 is illustrated as a three-terminal device as in FIGS. 2–5, and in this case, the two terminals formed on the bottom surface 82b of chip 82 are soldered to a substrate 86. The substrate 86 includes a pair of metal-clad openings 86a, 86b on either side of the chip 82, and the cooling tube 84 is bent downward as shown to pass through the openings 86a, 86b to form electrical interconnects between chip 82 and substrate 86. In the illustrated embodiment, the encapsulant 34 covers the chip 82 and a portion of the cooling tube 84, although it could be more or less extensive than shown. Alternatively, the terminals on the bottom surface 82b of chip 82 could be soldered to lead frame elements as in the embodiments of FIGS. 2–5, in which case the package 80 could be oriented different than shown in FIG. 6.

In summary, the present invention utilizes a fluid conducting cooling tube directly coupled to one or more semiconductor chips and a plastic encapsulant molded over the semiconductor chips and portions of the cooling tube in proximity to the semiconductor chips. The thermal transfer capability is significantly greater than achieved with conventional liquid cooling configurations, so that the cooling system can provide increased performance at lower coolant flow rates. While described in reference to the illustrated embodiments, it is expected that numerous modifications and variations in addition to those mentioned herein will occur to those skilled in the art. For example, the coolant tube may be configured as a heat pipe where cooling is achieved by a liquid phase change material instead of coolant flow; in this case, the heat pipe is sealed and no fittings or external pump are required. Accordingly, it is intended that the invention not be limited to the disclosed embodiment, but that it have the full scope permitted by the language of the following claims.

The invention claim is:

1. A microelectronic package, comprising:
   a first semiconductor chip;
   a fluid-carrying cooling tube disposed in proximity to a first surface of said first semiconductor chip;
   a thermally conductive bonding material directly electrically interconnecting said cooling tube and the first surface of said first semiconductor chip, mechanically and thermally bonding said cooling tube to said first surface; and
   a plastic encapsulant molded over said first semiconductor chip and portions of said cooling tube in proximity to said chip.

2. The microelectronic package of claim 1, wherein said cooling tube is copper and said thermally conductive bonding material is indium solder.

3. A microelectronic package, comprising:
   a first semiconductor chip;
   a fluid-carrying cooling tube disposed in proximity to a first surface of said first semiconductor chip;
   a thermally conductive bonding material disposed between said cooling tube and the first surface of said first semiconductor chip, thermally bonding said cooling tube to said first surface; and
   a plastic encapsulant molded over said first semiconductor chip and portions of said cooling tube in proximity to said chip,
   wherein said first surface of said first semiconductor chip is an active surface, and said cooling tube is utilized as an electrical terminal of said first semiconductor chip.

4. A microelectronic package, comprising:
   a first semiconductor chip;
   a fluid-carrying cooling tube disposed in proximity to a first surface of said first semiconductor chip;
   a thermally conductive bonding material disposed between said cooling tube and the first surface of said first semiconductor chip, thermally bonding said cooling tube to said first surface; and
   a plastic encapsulant molded over said first semiconductor chip and portions of said cooling tube in proximity to said chip,
   wherein said first surface of said first semiconductor chip is an active surface, and said microelectronic package comprises:
      a shunt element disposed adjacent said semiconductor chip and electrically coupled to said cooling tube to form an electrical circuit including said first surface, said cooling tube and said shunt element.

5. The microelectronic package of claim 4, where said shunt element is a copper slug soldered to said cooling tube and to a terminal of said package.

6. A microelectronic package, comprising:
   a first semiconductor chip;
   a fluid-carrying cooling tube disposed in proximity to a first surface of said first semiconductor chip;
   a thermally conductive bonding material disposed between said cooling tube and the first surface of said first semiconductor chip, thermally bonding said cooling tube to said first surface; and
   a plastic encapsulant molded over said first semiconductor chip and portions of said cooling tube in proximity to said chip,
   wherein said first surface of said first semiconductor chip is an active surface, and said microelectronic package further comprises:
      a second semiconductor chip having a first active surface; and
      said fluid-carrying cooling tube includes a first electrically conductive segment thermally bonded to the first surface of said first semiconductor chip, a second electrically conductive segment thermally bonded to the first surface of said second semiconductor chip, and an electrically non-conductive joint coupling said first and second segments to permit fluid transfer therebetween while providing electrical isolation between said first and second semiconductor chips.

7. The microelectronic package of claim 6, wherein said joint is a thermoplastic tube.

8. The microelectronic package of claim 6, wherein said joint is a void in said encapsulant between said first and second electrically conductive segments.

* * * * *